US011923344B2

(12) United States Patent
McPherson et al.

(10) Patent No.: US 11,923,344 B2
(45) Date of Patent: Mar. 5, 2024

(54) COMPACT POWER MODULE

(71) Applicant: Wolfspeed, Inc., Durham, NC (US)

(72) Inventors: Brice McPherson, Fayetteville, AR (US); Shashwat Singh, Fayetteville, AR (US); Roberto M. Schupbach, Raleigh, NC (US)

(73) Assignee: WOLFSPEED, INC., Durham, NC (US)

( * ) Notice: Subject to any disclaimer, the term of this patent is extended or adjusted under 35 U.S.C. 154(b) by 177 days.

(21) Appl. No.: 17/524,690

(22) Filed: Nov. 11, 2021

(65) Prior Publication Data

US 2023/0142930 A1     May 11, 2023

(51) Int. Cl.
*H01L 25/07*     (2006.01)
*H01L 23/498*     (2006.01)
(Continued)

(52) U.S. Cl.
CPC ...... *H01L 25/072* (2013.01); *H01L 23/49811* (2013.01); *H02M 7/003* (2013.01);
(Continued)

(58) Field of Classification Search
CPC ....... C23C 14/027; H01L 24/83; H01L 24/31; H01L 21/00; H01L 2924/01015; H01L 2224/8319; H01L 2924/01079; H01L 2924/01074; H01L 2224/83801; H01L 2924/01027; H01L 2924/01029; H01L 2924/01032; H01L 2924/01033; H01L 2924/01042; H01L 2924/01082; H01L 2924/01093; H01L 2924/01019; H01L 2924/01024; H01L 2924/014;
(Continued)

(56) References Cited

U.S. PATENT DOCUMENTS

| 2016/0315037 A1 | 10/2016 | Kadoguchi et al. |
| 2016/0351488 A1 | 12/2016 | Kamiyama |

(Continued)

FOREIGN PATENT DOCUMENTS

| DE | 212020000458 U1 | 6/2021 |
| GB | 2096394 A | 10/1982 |
| WO | WO 2021/187018 A1 | 9/2021 |

OTHER PUBLICATIONS

International Search Report and Written Opinion for Application No. PCT/US2022/049072, dated Mar. 27, 2023, 14 pages.

*Primary Examiner* — Elias Ullah
(74) *Attorney, Agent, or Firm* — Dority & Manning, P.A.

(57) ABSTRACT

A power module is provided with a substrate, power devices, and a housing. The power devices are mounted on device pads of the substrate and arranged to provide a power circuit having a first input, a second input, and at least one output. First and second power terminals provide first and second inputs for the power circuit. At least one output power terminal provides at least one output. The housing encompasses the substrate, the power devices, and portions of the first and second input power terminals as well as the at least one output power terminal. The first and second input power terminals extend out of a first side of the housing, and the at least one output power terminal extends out of a second side of the housing, the first side being opposite the second side.

29 Claims, 14 Drawing Sheets

(51) Int. Cl.
*H02M 7/00* (2006.01)
*H01L 23/00* (2006.01)
*H01L 23/34* (2006.01)
*H02M 7/5387* (2007.01)

(52) U.S. Cl.
CPC ........ *H01L 23/34* (2013.01); *H01L 23/49861* (2013.01); *H01L 24/48* (2013.01); *H01L 2224/48105* (2013.01); *H01L 2224/48175* (2013.01); *H01L 2924/10272* (2013.01); *H01L 2924/13091* (2013.01); *H02M 7/5387* (2013.01)

(58) Field of Classification Search
CPC ........... H01L 2924/01006; H01L 2924/12036; H01L 2924/00011; H01L 2924/0132; H01L 2924/01014; H01L 2924/3512; H01L 2924/00; H01L 2224/83205
See application file for complete search history.

(56) References Cited

U.S. PATENT DOCUMENTS

| | | | |
|---|---|---|---|
| 2017/0110395 A1 | 4/2017 | Iwabuchi et al. | |
| 2017/0309391 A1* | 10/2017 | Eicher | H02M 3/33592 |
| 2021/0305166 A1 | 9/2021 | Moxey et al. | |
| 2021/0313256 A1 | 10/2021 | McPherson et al. | |

\* cited by examiner

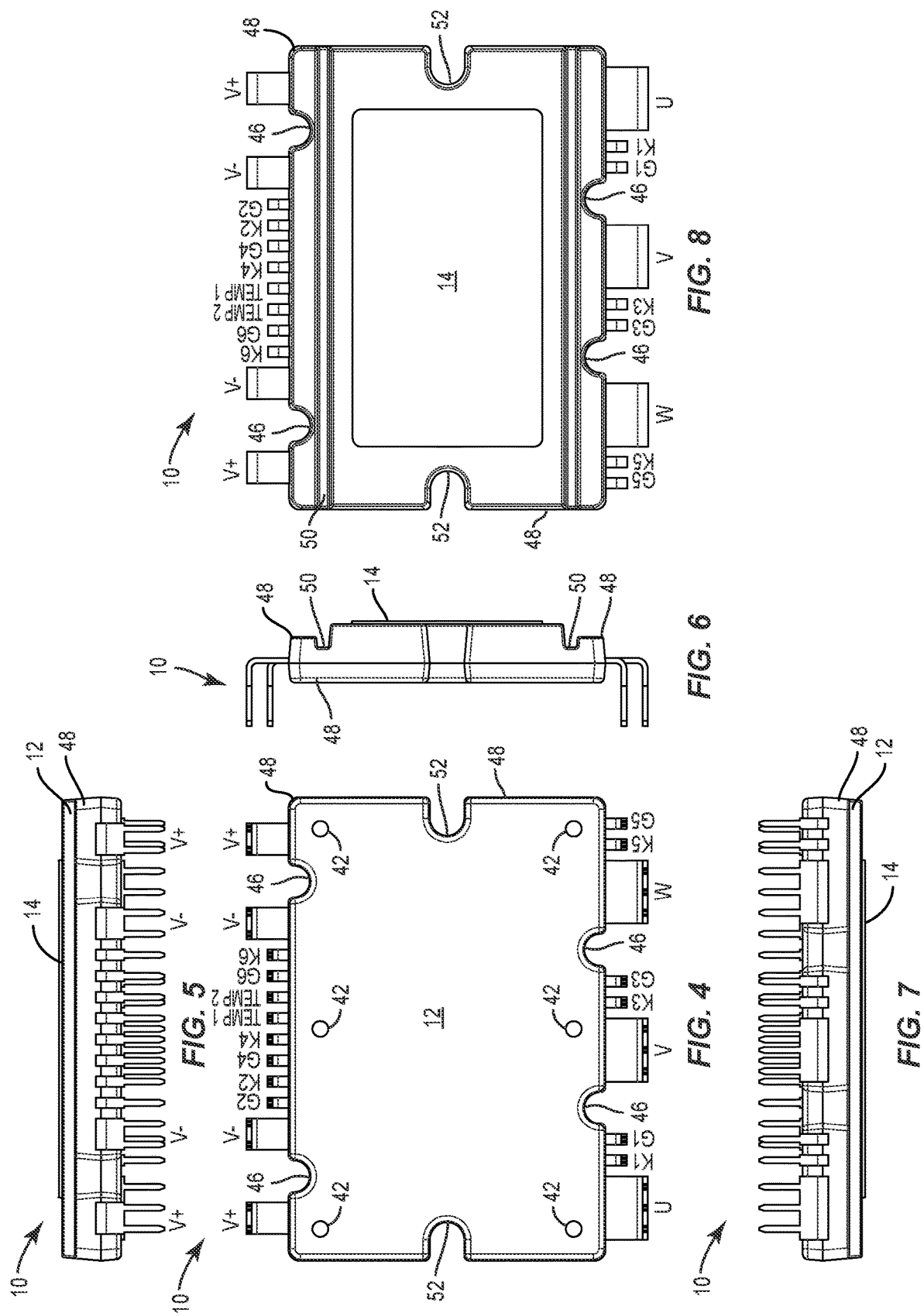

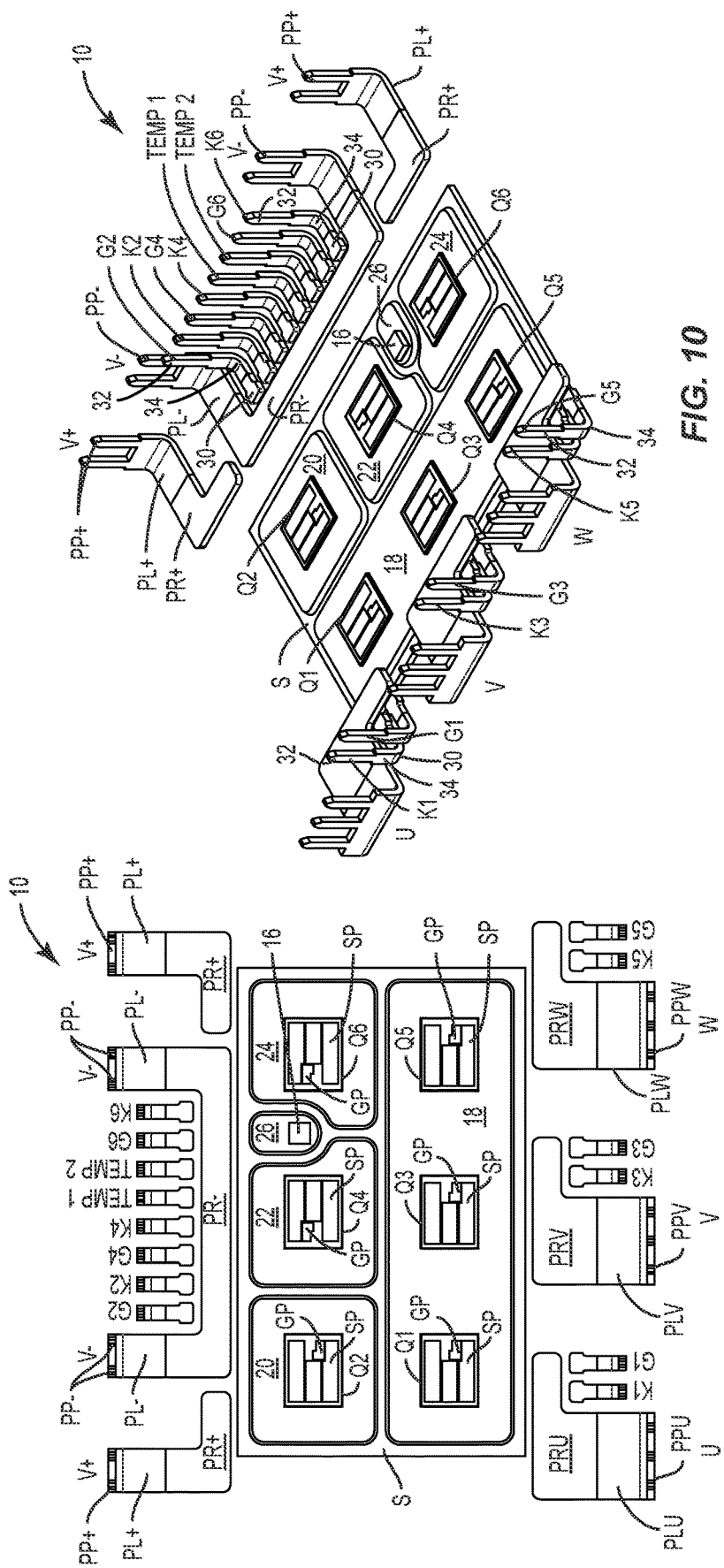
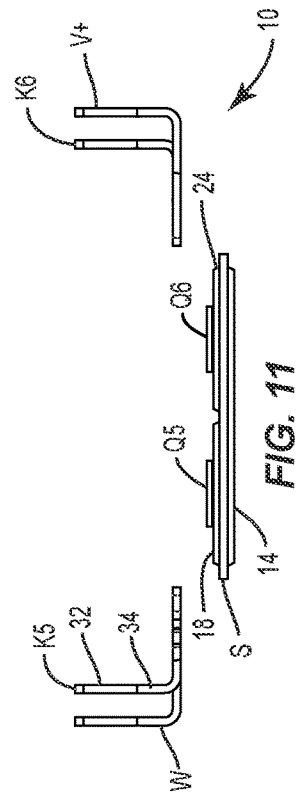
FIG. 10
FIG. 11
FIG. 9

*(LARGER DEVICES)*

*(SMALLER DEVICES)*

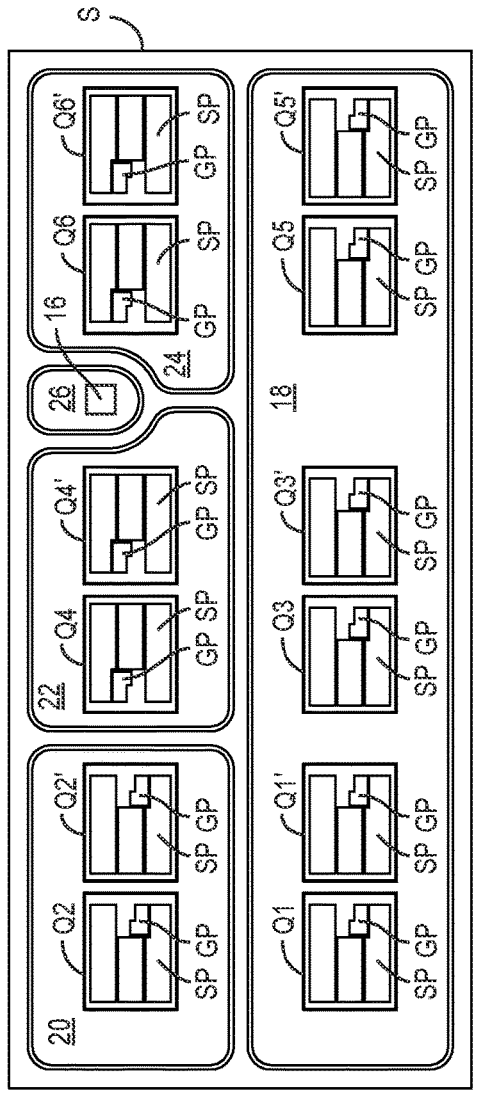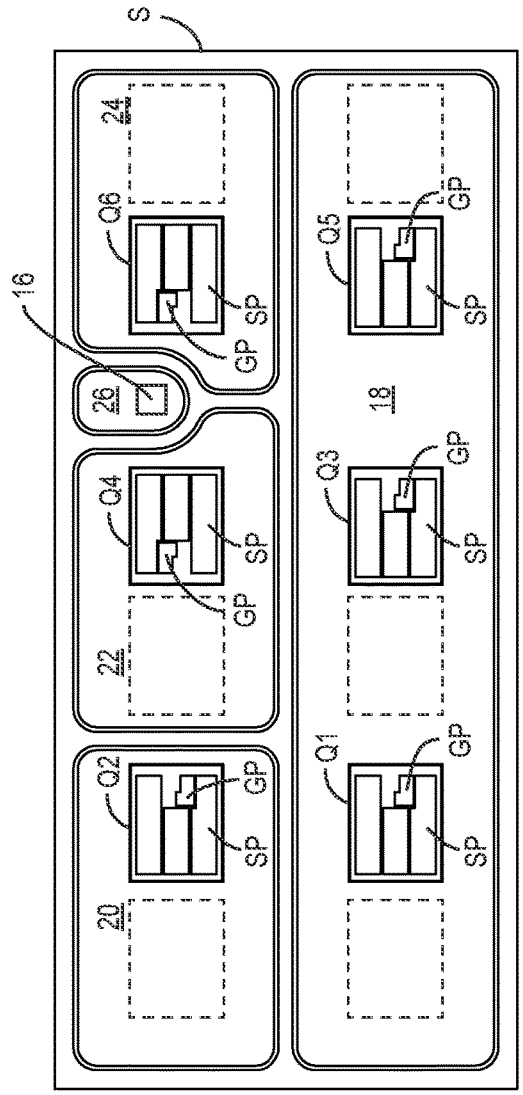

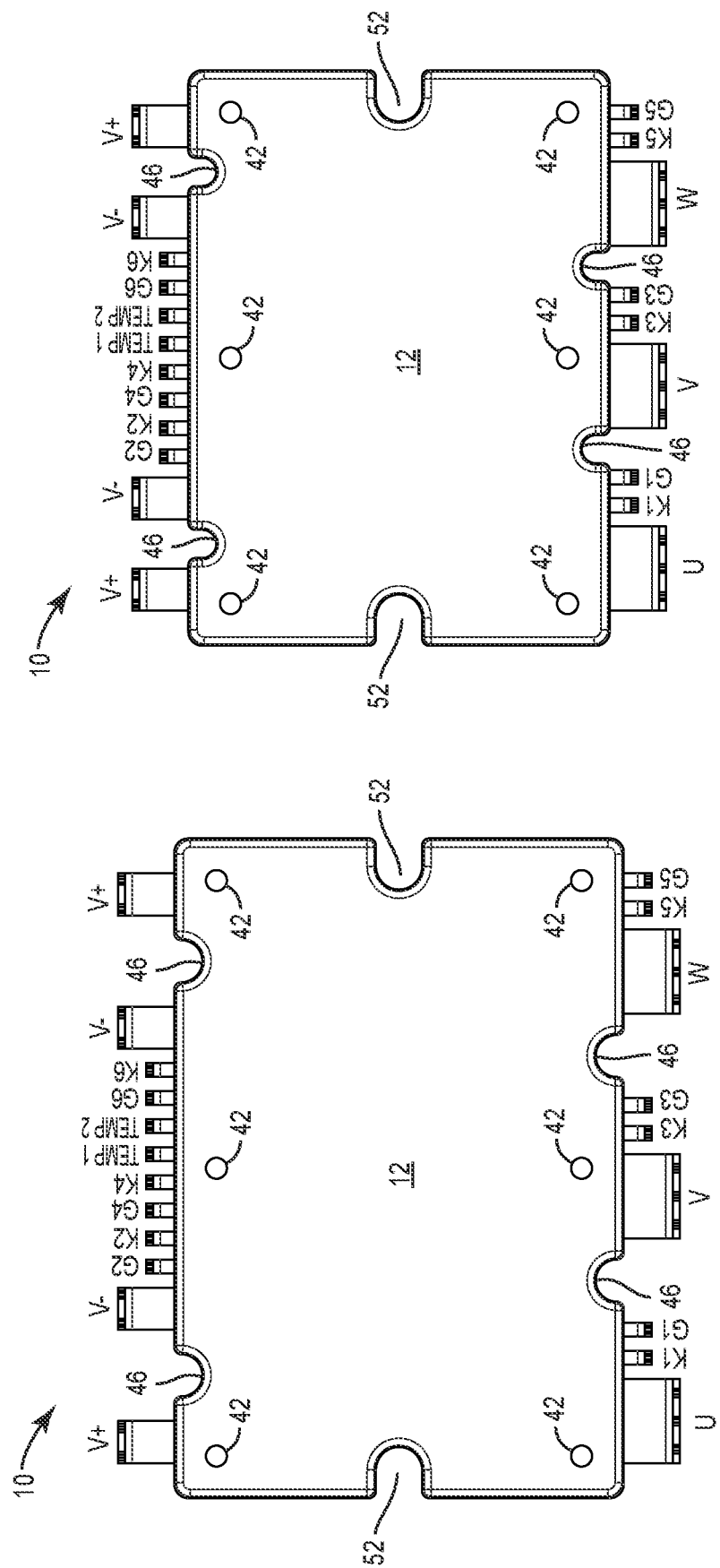

COMPACT POWER MODULE

FIELD OF THE DISCLOSURE

The present disclosure relates to power modules for high power applications.

BACKGROUND OF THE DISCLOSURE

In high power applications, multiple components for all or a portion of a circuit are often packaged in electronic modules. These modules are generally referred to as power modules that are housed in a thermoplastic, epoxy, or like molded housing that encapsulates the components and the circuit board or substrate on which the components are mounted. The input/output connections for the power module are provided by terminal assemblies that extend out of the housing to facilitate incorporation in and connection to other systems. Such systems may include electric vehicles, power conversion and control, and the like.

SUMMARY

A power module is provided with a substrate, powers devices, and a housing. The substrate has a backside with a thermal pad and a frontside having a plurality of device pads. The power devices are mounted on the device pads and arranged to provide a power circuit having a first input, a second input, and at least one output. A first input power terminal provides a first input for the power circuit. A second power terminal provides a second input for the power circuit. At least one output power terminal provides at least one output for the power circuit. The housing encompasses the substrate, the power devices, and portions of the first input power terminal, second input power terminal, and the at least one output power terminal. The first input power terminal and the second input power terminal extend out of a first side of the housing, and the at least one AC output power terminal extends out of a second side of the housing, the first side opposite the second side.

In one embodiment, a third input power terminal provides the first input for the power circuit, wherein the second input power terminal resides between the first input power terminal and the third input power terminal.

In one embodiment, the second input power terminal has a first power terminal leg, a second power terminal leg, and a rail that resides within the housing and connects the first power terminal leg with the second power terminal leg.

In one embodiment, the first input power terminal is adjacent the first power terminal leg of the second input power terminal and the third input power terminal is adjacent the second power terminal leg of the second input power terminal.

In one embodiment, a plurality of signal terminals provides a plurality of control signals for the power circuit, wherein portions of the plurality of signal terminals extend out of the housing.

In one embodiment, the plurality of signal terminals comprises a first plurality of gate signal terminals that provide gate control signals to gates of a first set of the plurality of power devices and a second plurality of gate signal terminals that provide gate control signals to gates of a second set of the plurality of power devices.

In one embodiment, the plurality of signal terminals further includes a first plurality of source-Kelvin signal terminals that provide source-Kelvin control signals to sources of the first set of the plurality of power devices and a second plurality of source-Kelvin signal terminals that provide source-Kelvin control signals to sources of the second set of the plurality of power devices.

In one embodiment, the first plurality of source-Kelvin signal terminals and the first plurality of gate signal terminals are between the first power terminal leg and the second power terminal leg of the second input power terminal.

In one embodiment, the at least one output power terminal includes a first output power terminal providing a first output of the power circuit, a second output power terminal providing a second output of the power circuit, and a third output power terminal providing a third output of the power circuit.

In one embodiment, a first of the second plurality of source-Kelvin signal terminals is adjacent the first output power terminal, a second of the second plurality of source-Kelvin signal terminals is adjacent the second output power terminal, and a third of the second plurality of source-Kelvin signal terminals is adjacent the third output power terminal.

In one embodiment, a first of the second plurality of gate signal terminals is adjacent the first source-Kelvin signal terminal, a second of the second plurality of gate signal terminals is adjacent the second source-Kelvin signal terminal, and a third of the second plurality of gate signal terminals is adjacent the third source-Kelvin signal terminal.

In one embodiment, a plurality of signal terminals provides a plurality of control signals for the power circuit, wherein portions of the plurality of signal terminals extend out of the housing.

In one embodiment, the plurality of signal terminals are grouped together and with the first input power terminal, the second input power terminal, and the at least one output power terminal based on electrical potential expected during operation.

In one embodiment, each of the plurality of signal terminals are terminated with at least one linear pin configured for solder attachment to another apparatus.

In one embodiment, each of the first input power terminal, the second input power terminal, and the at least one power terminal are terminated with at least one linear pin configured for solder attachment to another apparatus.

In one embodiment, each of the plurality of signal terminals, the first input power terminal, the second power terminal, and the at least one output power terminal are terminated with at least two linear pins configured for solder attachment to another apparatus.

In one embodiment, pins for the first group of the plurality of signal terminals are aligned in a first plane along the first side of the housing, pins for a second group of the plurality of signal terminals are aligned in a second plane along the second side of the housing, pins for the first and second input power terminals are aligned in a third plane along the first side of the housing, and pins for the at least one output power terminal are aligned in a fourth plane along the second side of the housing. In one embodiment, the first and second planes are inside of the third and fourth planes.

In one embodiment, the plurality of signal terminals are grouped together and with the first input power terminal, the second input power terminal, and the at least one output power terminal based on electrical potential expected during operation.

In one embodiment, the plurality of signal terminals comprise a first plurality of gate signal terminals that provide gate control signals to gates of a first set of the plurality of power devices and a second plurality of gate signal terminals that provide gate control signals to gates of a second set of the plurality of power devices.

In one embodiment, the plurality of signal terminals includes a first plurality of source-Kelvin signal terminals that provide source Kelvin control signals to sources of the first set of the plurality of power devices and a second plurality of source-Kelvin signal terminals that provide source Kelvin control signals to sources of the second set of the plurality of power devices.

In one embodiment, the at least one output power terminal includes a first output power terminal providing a first output of the power circuit, a second output power terminal providing a second output of the power circuit, and a third output power terminal providing a third output of the power circuit.

In one embodiment, the thermal pad is exposed through the housing.

In one embodiment, the power circuit is a three-phase circuit.

In one embodiment, notches are recessed into one or more sides of the housing for attaching the power module to another apparatus.

In one embodiment, each of the first input power terminal, the second DC power terminal, and the at least one output power terminal are terminated with at least one linear pin configured for solder attachment to another apparatus.

In one embodiment, creepage extenders are provided on top and bottom sides of the housing to extend the surface distance between certain terminals.

In one embodiment, at least one notch is provided in the sides of the housing between the first input power terminal and the second input power terminal to extend the surface distance between certain terminals.

In one embodiment, a temperature circuit is provided on the substrate.

Based on the above, the present disclosure relates to a compact, high voltage, high current, low inductance power module designed for the next generation of silicon carbide (SiC) and other material system power devices and power electronics applications. It utilizes a novel layout incorporating a size- and cost-optimized power substrate.

A feature of this design is scalability and modularity. The layout can widen and lengthen to either (1) accommodate larger devices or (2) place more devices in parallel. Essentially, the package concept can scale up or scale down to meet the power processing needs without forfeiting any of the performance benefits that the package offers. It is also straightforward to arrange these packages in parallel, increasing the current of a converter and/or forming topologies such as half- and full-bridges (often used in DC-DC power conversion) as well as three-phase circuits (used in motor drives and inverters).

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 4 is a top plan view of the power module according to the first embodiment of the disclosure.

FIGS. 5, 6, and 7 are corresponding side views of the power module according to the first embodiment of the disclosure.

FIG. 8 is a bottom plan view of the power module according to the first embodiment of the disclosure.

FIGS. 9, 10, and 11 are top plan, top isometric, and side plan views of the power module without a housing or bond wires according to the first embodiment of the disclosure.

FIG. 24 illustrates an exemplary embodiment of the power module for use with parallel power devices.

FIG. 25 illustrates an exemplary embodiment of the power module where certain available locations for power devices are not used.

FIGS. 30 and 31 are top plan views of the power modules of FIGS. 28 and 29 with the housing.

DETAILED DESCRIPTION

Figure 1B:
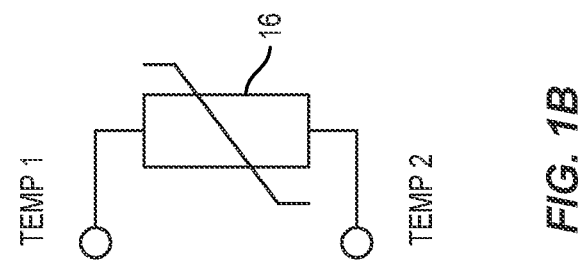
FIG. 1B Illustrates a temperature circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to power modules that are used in high power applications. Power modules may contain one or more power semiconductor devices, such as metal oxide semiconductor field effect transistors (MOSFETs), insulated gate bipolar transistors (IGBTs), diodes, and the like, arranged into a variety of circuit topologies. Typical circuit topologies include, but are not limited to, a single switch, a half H-bridge circuit, a full H-bridge circuit, and a three-phase switching circuit, which is often referred to as a six-pack.

For the following discussion, a three-phase circuit is used to facilitate an understanding of the packaging concepts disclosed herein. An exemplary three-phase circuit is illustrated in FIG. 1A, according to one embodiment of the disclosure. Assume for this example that transistors Q1-Q6 are power silicon carbide (SiC) MOSFETs that each have drain (D), gate (GX), source (S), and source-Kelvin (KX) terminals. For the embodiments described below, transistors Q1-Q6 are vertical, N channel MOSFETs, wherein the drain contact is on the bottom of the device and the source, gate, and source-Kelvin contacts are on the top of the device.

Each high side transistor Q1, Q3, Q5 is coupled in series with a corresponding low side transistor Q2, Q4, Q6. The drains D of the high side transistors Q1, Q3, Q5 are coupled to a V+ terminal, and the sources S of the low side transistors Q2, Q4, Q6 are coupled to the V− terminal. For the first leg of the three-phase circuit, the source S of high side transistor Q1 is coupled to the drain D of the low side transistor Q2 to provide a first output, which is referenced as terminal U. For the second leg of the three-phase circuit, the source S of high side transistor Q3 is coupled to the drain D of the low side transistor Q4 to provide a second output, which is referenced as terminal V. For the third leg of the three-phase circuit, the source S of high side transistor Q5 is coupled to the drain D of the low side transistor Q6 to provide a third output, which is referenced as terminal W. Each of the transistors Q1-Q6 also have independent gate terminals G1-G6 (GX generally) and source-Kelvin terminals K1-K6 (KX generally).

Figure 1A:
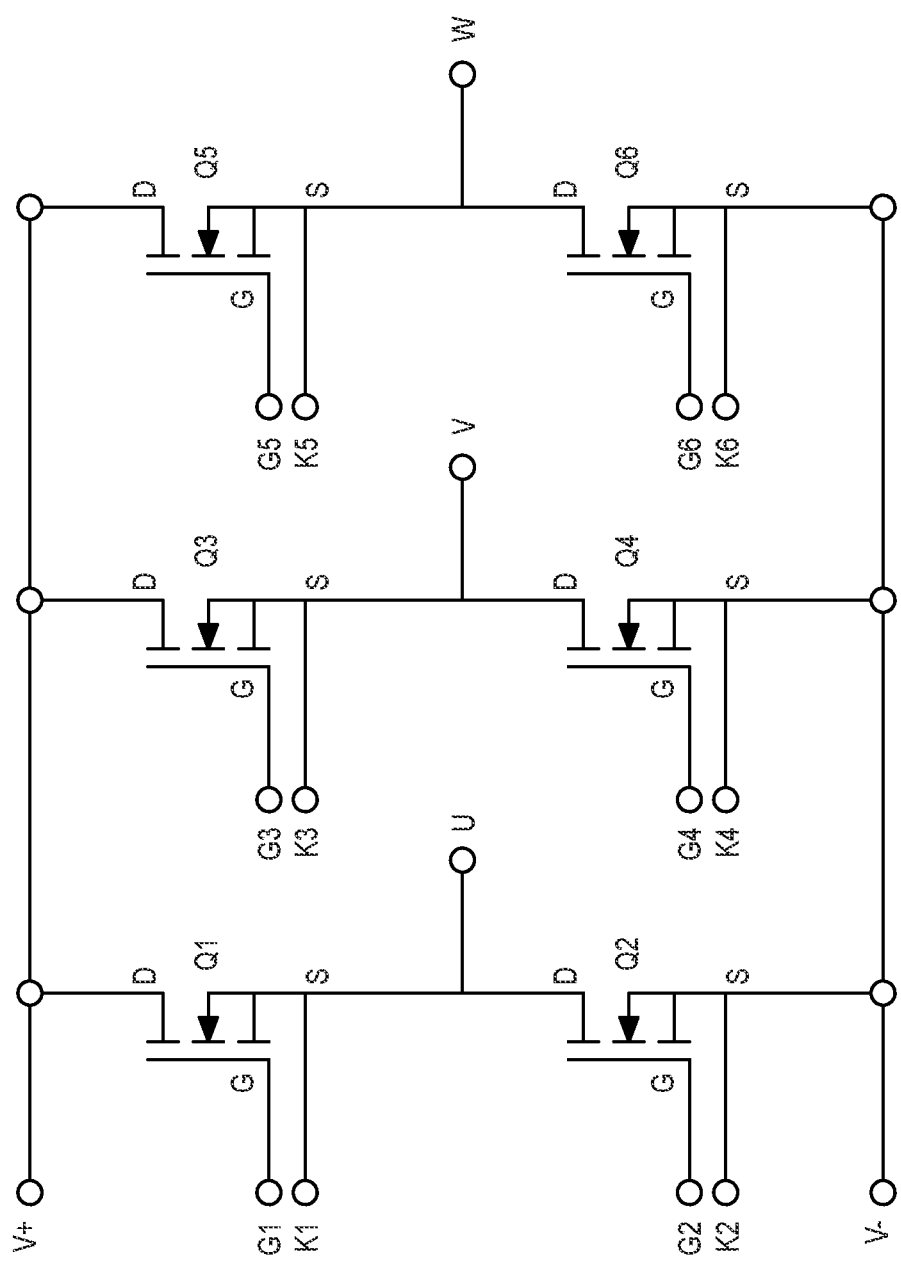
FIG. 1A illustrates a schematic of a three-phase circuit.

As illustrated in FIG. 1B, additional circuitry, such as a temperature circuit 16 for sensing internal device temperatures, may be provided in association with the three-phase circuit and can be as simple as a thermistor or resistance temperature detector (RTD) with terminals TEMP1 and TEMP2. In such embodiments, the resistance of the thermistor or RTD will change with temperature and be measurable across terminals TEMP1 and TEMP2. The thermistor will generally have a negative temperature coefficient in that the resistance has a negative correlation to temperature, while the RTD will generally have a positive temperature coefficient in that the resistance has a positive correlation to temperature. Additional circuits, such as current sensing, may be conceived using functional elements and dedicated pins.

Figure 3:
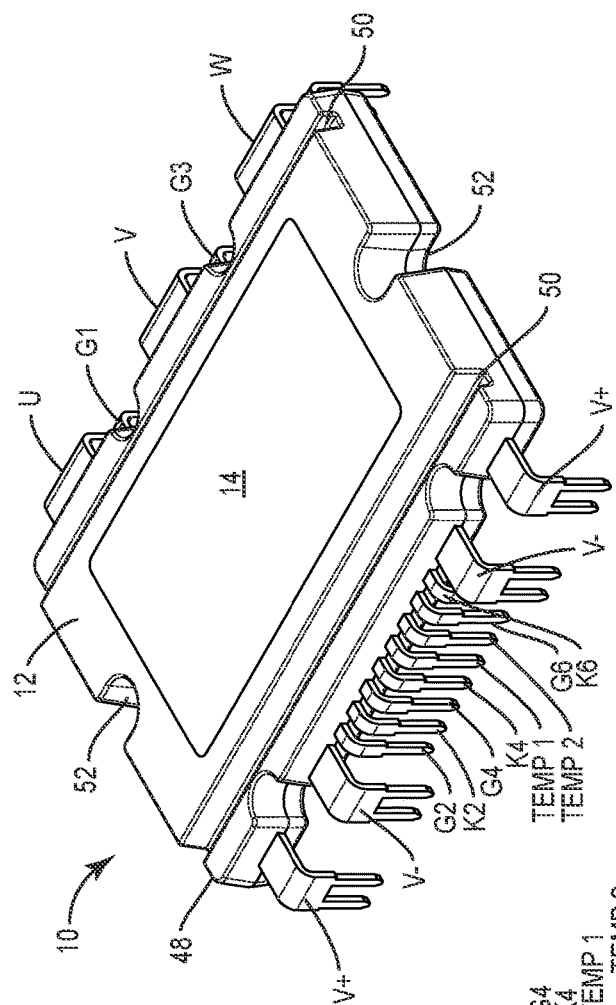
FIG. 3 is an isometric view of a bottom side of a power module according to a first embodiment of the disclosure.
Figure 2:
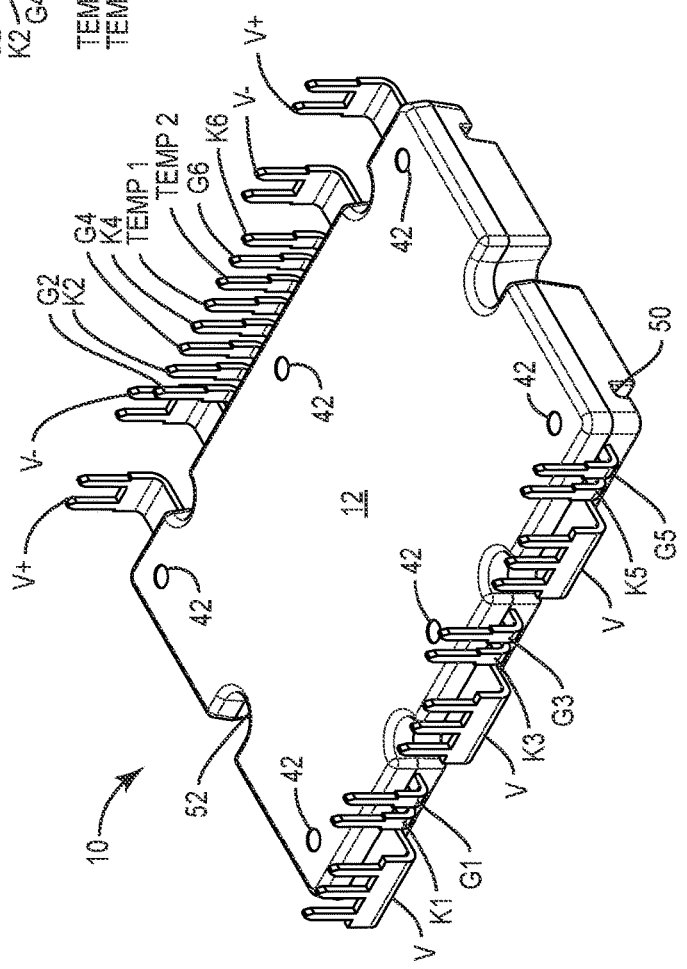
FIG. 2 is an isometric view of a top side of a power module according to a first embodiment of the disclosure.

FIGS. 2-8 are various isometric and plan views of a power module 10 that provides the electronics necessary to implement various power circuits, such as the three-phase circuit and temperature circuit 16 of FIGS. 1A and 1B, according to the first embodiment. FIGS. 2 and 3 are top and bottom isometric views. FIG. 4 is a top plan view. FIGS. 5, 6, and 7 are opposing side and end views, respectively. FIG. 8 is a bottom plan view. The power module 10 has a housing 12 that may include a thermal pad 14, which is visible in FIGS. 3 and 5-8. While the housing 12 may be molded as described below, other types are housings are also envisioned. The thermal pad 14 is electrically isolated to any of the internal circuitry and facilitates the transfer of heat from the power module 10 to ambient, a heat sink structure, or the like, which is not depicted. Other referenced features in these figures are described further below after a description of the internal architecture of the power module 10.

Figure 15:
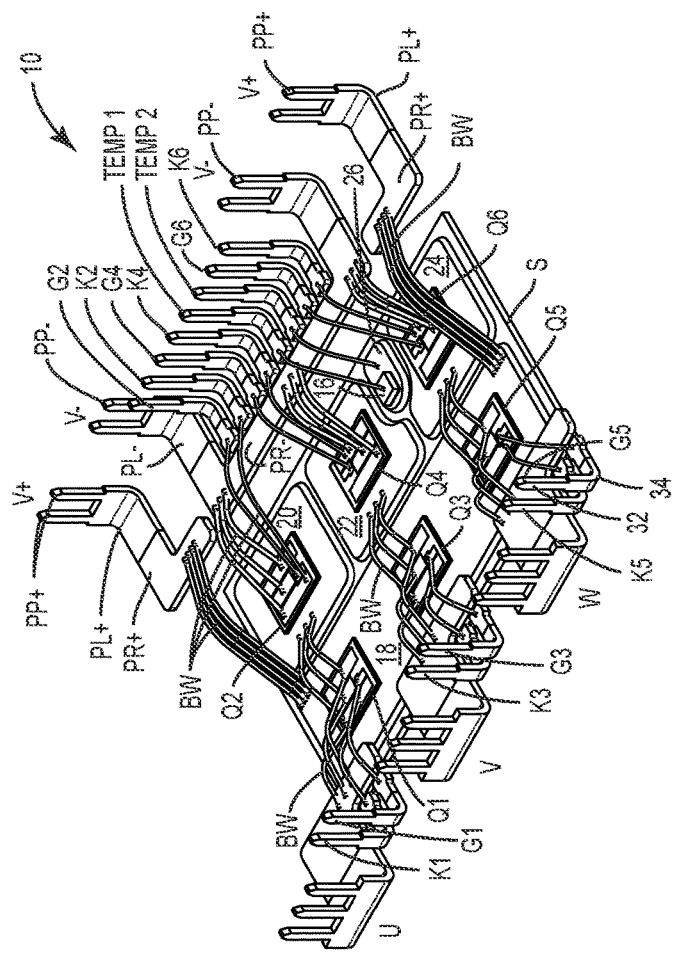
FIGS. 14, 15, and 16 are top plan, top isometric, and side plan views of the power module without a housing and with bond wires according to the first embodiment of the disclosure.
Figure 16:
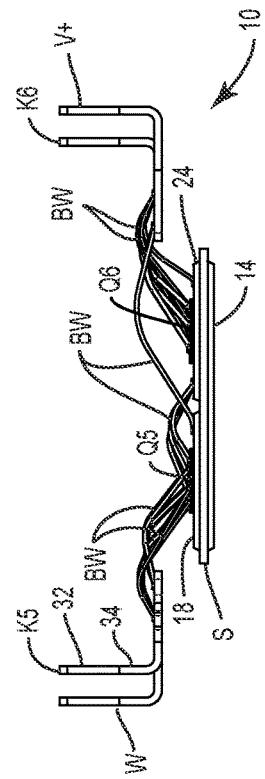
Figure 14:
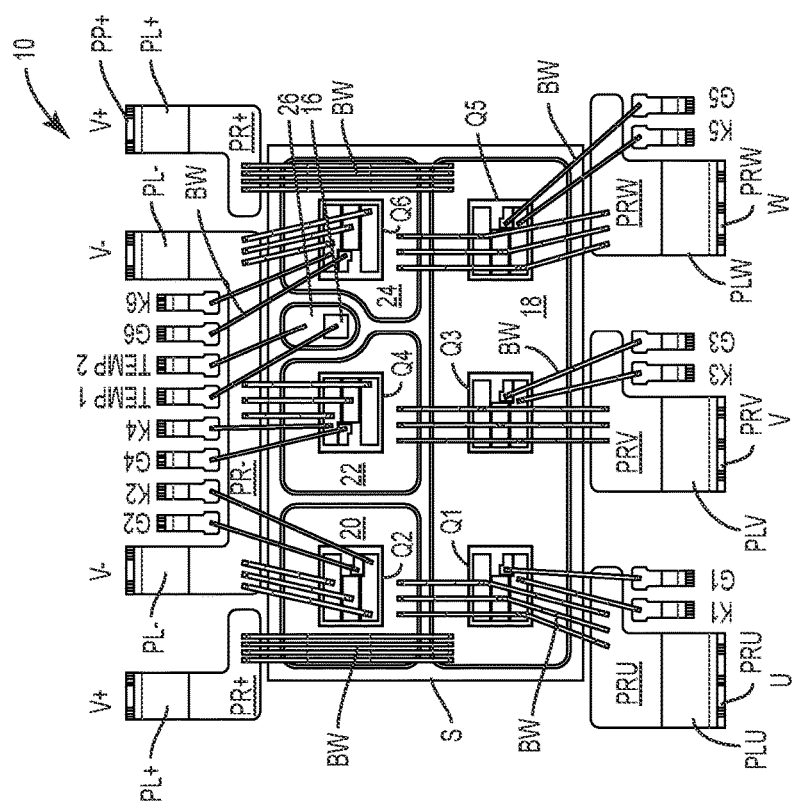

FIGS. 9-11 illustrate various isometric and plan views of the internal architecture of the power module 10, wherein the housing 12 and bond wires BW (or like interconnects) are removed to more clearly illustrate the various components of the internal architecture. FIGS. 14-16 illustrate various isometric and plan views of the internal architecture of the power module 10 with the bond wires BW in place for an embodiment for the three-phase circuit. The following description is directed primarily to FIGS. 9-11 where the bond wires BW are not shown.

At the heart of the internal architecture is a substrate S upon which numerous conductive device pads 18, 20, 22, 24, 26 are formed on a one side. The thermal pad 14 is formed on the opposite side, as best illustrated in FIG. 11. The device pads 18-26 and the thermal pad 14 may be formed from any conductive material, such as copper or the like. For the three-phase circuit of FIG. 1A, the high-side transistors Q1, Q3, Q5 are mounted on the elongated device pad 18, which extends along the side adjacent power terminals U, V, W. Low-side transistor Q2 resides on the device pad 20, which is alongside of device pad 18 and adjacent one of the power terminals V+. Low-side transistor Q6 resides on the device pad 24, which is alongside of device pad 18 and adjacent the other of the power terminals V+. Low-side transistor Q4 resides on the device pad 22, which is alongside of device pad 18, between device pads 20 and 24, and adjacent the power terminals V−. The temperature circuit 16 resides on device pad 26, which is formed on the substrate, and in this embodiment, between device pads 22 and 24. Each of the device pads 18-26 are isolated from each other.

In one embodiment, the drains D of the various transistors Q1-Q6 are directly attached to the respective device pads 18-24 to form both a mechanical and electrical connection of the transistors Q1-Q6 to the device pads 18-24. The temperature circuit 16 may be mechanically and electrically connected to device pad 26 in similar fashion. The device pads 18-26 are electrically isolated from each other.

The various terminals can be segregated into power terminals and signal terminals. As noted above, the power terminals include power terminals V+, V−, U, V, and W. The signal terminals include signal terminals G1-G6, K1-K6, TEMP1, TEMP2. While each of these terminals may take any shape necessary to work with the intended applications, those shown are geared toward being soldered, press-fitting, or snapping into corresponding holes into a printed circuit board (not shown). As illustrated, the direct current (DC) input power terminals V− and V+ extend out of one side of the housing 12 of the power module 10, and the alternating current (AC) output power terminals U, V, W extend out of the opposite side of the power module 10. Power terminal V− is U-shaped, wherein two power legs PL− are connected by a power rail PR−. The power legs PL− provide an approximately 90-degree (80 to 100 degree) bend and are terminated with a pair of power pins PP−. While each of the power legs PL− are shown with two power pins PP−, the power legs PL− may have one, three, or more power pins PP−. The power rail PR− is typically inside the housing 12, wherein an exterior portion of the power legs PL− and the entirety of the power pins PP− are outside of the housing 12.

Each of the pair of power terminals V+ has a power rail PR+ and a power leg PL+ that extends from one end of the power rail PR+. The power legs PL+ provide an approximately 90-degree (80 to 100 degrees) bend and are terminated with a pair of power pins PP+. While each of the power legs PL+ are shown with two power pins PP+, the power legs PL+ may have one, three, or more power pins PP+. The power rail PR+ is typically inside the housing 12, wherein an exterior portion of the power legs PL+ and the entirety of the power pins PP+ are outside of the housing 12.

Each of the power terminals U, V, and W may take the same or similar form as the power terminals V+. As such, the power terminals U, V, and W have a power rails PRU, PRV, PRW and power legs PLU, PLV, PLW that extend from one end of the corresponding power rails PRU, PRV, PRW. The power legs PLU, PLV, PRW provide an approximately 90-degree (80 to 100 degree) bend and are terminated with a pair of power pins PPU, PPV, PPW. While each of the power legs PLU, PLV, PLW are shown with two power pins PPU, PPV, PPW, the power legs PLU, PLV, PLW may have one, three, or more power pins PPU, PPV, PPW. The power rails PRU, PRV, PRW are typically inside the housing 12, wherein an exterior portion of the power legs PLU, PLV, PLW and the entirety of the power pins PPU, PPV, PPW are outside of the housing 12.

As illustrated with signal terminal G1 in FIGS. 10 and 11, each of the terminals G1-G6, K1-K6 has a signal pad 30, a signal pin 32, and a signal leg 34 connecting the signal pad 30 and the signal pin 32. The signal leg 34 provides a 90-degree bend (80-100 degrees), wherein a portion of the signal leg 34 and the signal pin 32 is outside of the housing 12 and the signal pad 30 is entirely inside of the housing 12.

As described below, the signal terminals G1-G6, K1-K6 are located and nested together with the power terminals V+, V−, U, V, W based on the electrical potential. With reference to FIGS. 9 and 10, signal terminals G2, K2, G4, K4, Temp1, Temp2, G6, K6 are linearly nested between the power legs PL− and along the power rail V− of the power terminal V−. The electrical potential of signal terminals G2, K2, G4, K5, G6, K6 generally correlate with that of power terminal V− during operation. Signal terminals K1, G1 are linearly nested along the power rail PRU of power terminal U wherein signal terminal K1 is between power leg PLU and the signal terminal G1. The electrical potential of signal terminals K1, G1 generally correlate with that of power terminal U during operation. Signal terminals K3, G3 are linearly nested along the power rail PRV of power terminal V, wherein signal terminal K3 is between power leg PLU and the signal terminal G3. The electrical potential of signal terminals K3, G3 generally correlate with that of power terminal V during operation. Signal terminals K5, G5 are linearly nested along the power rail PRU of power terminal W wherein signal terminal K5 is between power leg PLW and the signal terminal G5. The electrical potential of signal terminals K5, G5 generally correlate with that of power terminal W during operation. Arranging or grouping the various terminals based on electrical potential improves device performance, reduces the influence of one switching path on another, and helps reduce package size as less creepage and/or clearance distances are needed, in comparison to no grouping where each pin, not group, would require isolation distances.

In the illustrated embodiment, the signal terminals G2, K2, G4, K4, Temp1, Temp2, G6, K6 are adjacent one another and linearly aligned such that all of these signal pins reside in a first plane and terminate along a first line on a first side of the power module 10. Similarly, signal terminals G1, K1, G3, K3, G5, K5 are linearly aligned such that all of these signal pins reside in a second plane and terminate along a second line on a second side of the power module 10 that is opposite that of the first side. The power terminals V− and V+ are linearly aligned along the first side of the power module 10, wherein the power pins PP+ and PP− reside in third plane and terminate along a third line. The power terminals U, V, W are linearly aligned along the second side of the power module 10 wherein the power pins PPU, PPV, PPW reside in fourth plane and terminate along a fourth line. As such, the power terminals on either side of the power module 10 are aligned with one another, the signal terminals on either side of the power module 10 are aligned with one another, but the signal terminals and the power terminals are not aligned with each other in a staggered, dual in-line package configuration. In alternative embodiments, the power and signal terminals on each side of the power module 10 may be aligned with each other instead of being offset or staggered as described above.

Figure 13:
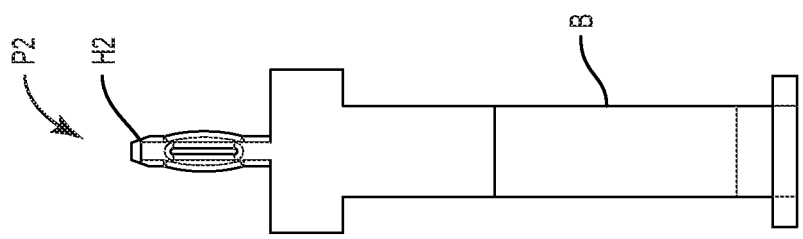
FIGS. 12 and 13 illustrate terminal pins according to two embodiments of the disclosure.
Figure 12:
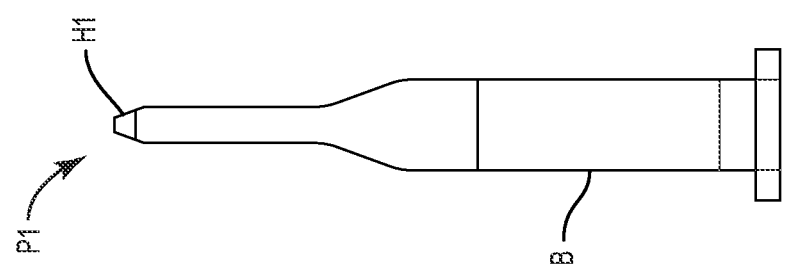

FIGS. 12 and 13 show two exemplary pin configurations for any of the various pins (PP+, PP−, PPU, PPV, PPW, G1-6, K1-6) described above. The pin P1 of FIG. 12 has a linear body B that narrows into a linear head H1, which is configured to be inserted into a corresponding aperture of a printed circuit board or the like and soldered to facilitate a mechanical and electrical connection between the printed circuit board and the head H1. Pin P2 of FIG. 13 has a press-fit head H2 at the end of the linear body B. The press-fit head H2 is designed to compress radially when inserted into the corresponding aperture of the printed circuit board to provide a solderless mechanical and electrical connection between the printed circuit board and the head H1. Once inserted, the press-fit head will apply outward, radial pressure to secure the press-fit head H2 in the corresponding aperture. Multiple press fit head styles could be used, depending on the thickness of the metal and insertion process.

Figure 18:
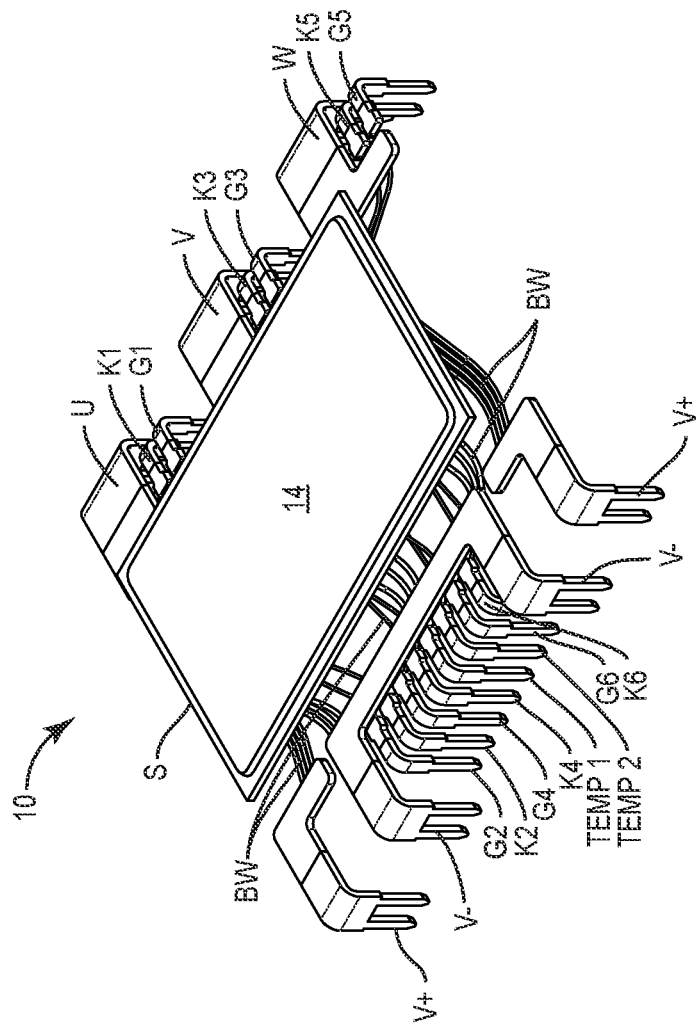
FIGS. 17 and 18 are top plan and top isometric views of the power module without a housing according to the first embodiment of the disclosure.
Figure 17:
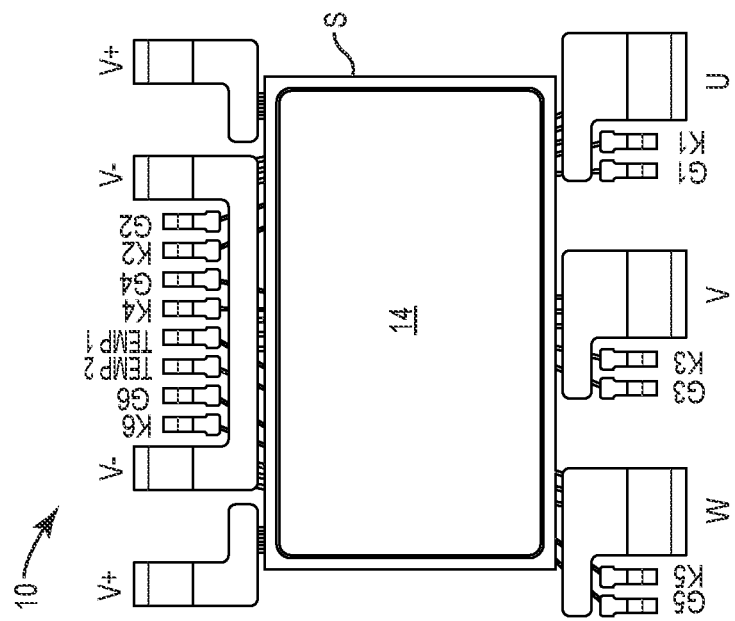

FIGS. 14-18 illustrate various isometric and plan views of the internal architecture of the power module 10, wherein the housing 12 is hidden and bond wires BW (or like interconnects) are illustrated. The bond wires BW in association with the device pads 18-24 form the electrical interconnects necessary to implement the three-phase circuit and temperature circuit 16 of FIGS. 1A and 1B. FIGS. 14, 15, and 16 correspond to FIGS. 9, 10, and 11, but with bond wires illustrated. FIGS. 17 and 18 are plan isometric views of the bottom side of the power module 10.

Figure 19:
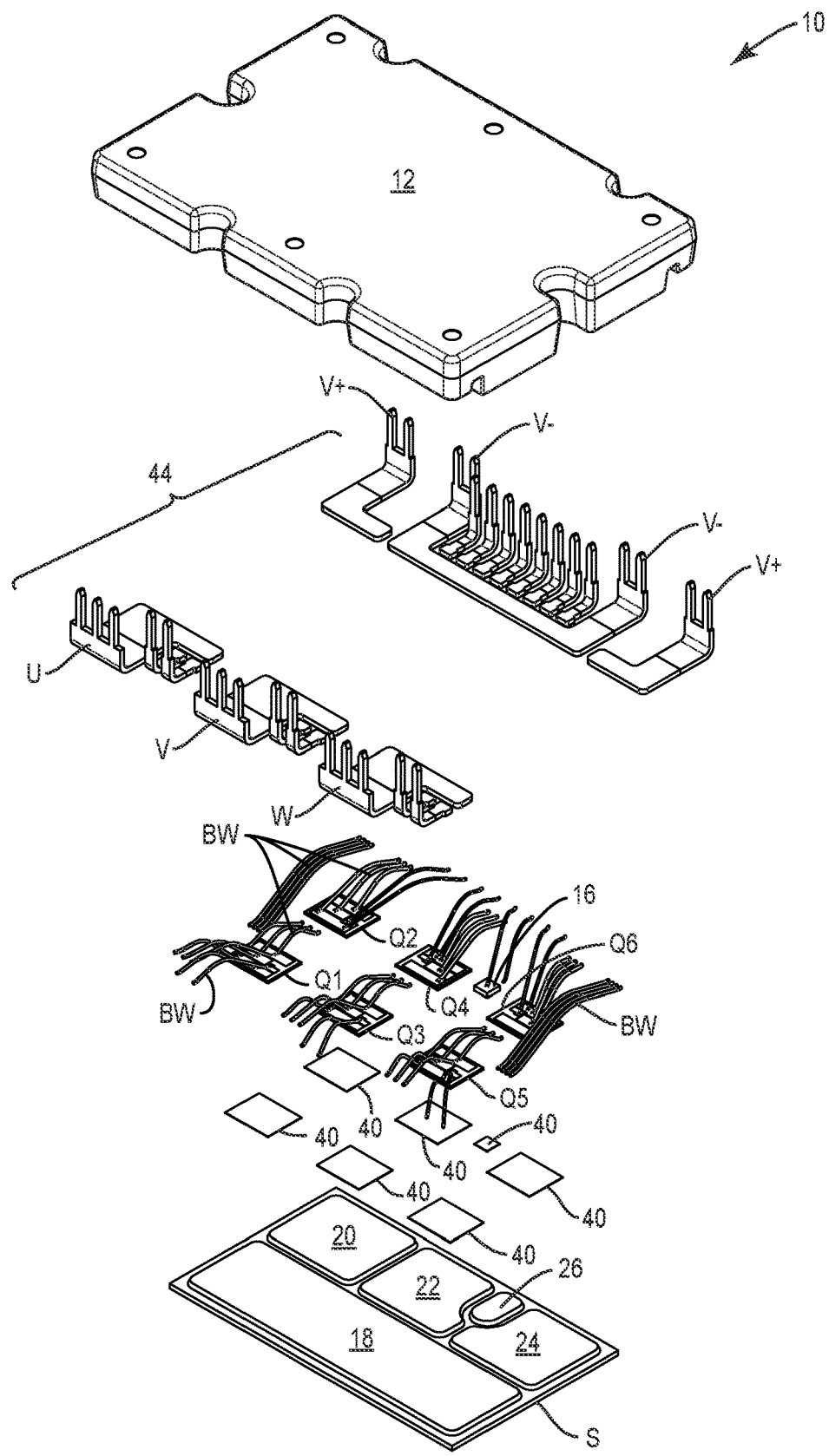
FIG. 19 is an exploded view of the first embodiment of the present disclosure.

Reference is now made to the exploded view of the power module 10 in FIG. 19. Starting from the bottom of the figure, the drain pads of transistors Q1-Q6 and the temperature circuit 16 are electrically and mechanically attached to the device pads 18-24 and the temp device pad 26 of the substrate S using device attach material 40. The device attach material 40 may be a solder, adhesive, sintered metal, or the like that provides for mechanical structure, high current interconnection, and high thermal conductivity.

The power terminals V+, V−, U, V, W, signal terminals G1-G6, K1-K6, and temperature circuit signal terminals TEMP1, TEMP2 may be formed from a single lead frame 44. As noted above, bond wires BW are used to the make the various component and terminal connections necessary to implement the three-phase and temperature circuits of FIGS. 1A and 1B. The device attach material 40 may be solder, adhesive, sintered metal, a laser weld, an ultrasonic weld, and the like that provides mechanical structure, high current interconnection, and high thermal conductivity. The lead frame 44 is typically a metal contact strip for high current external connection and internal interconnection. Any contacts are joined together on a single sheet, often with multiple products per sheet, and processed as an array before being formed and singulated. The bond wires BW may be ultrasonically or thermosonically bonded large diameter wire capable of supporting relatively high current electrical interconnection.

The housing 12 may be formed using a transfer or an injection molding process to provide mechanical structure, high voltage isolation. The housing 12 encapsulates the internal parts of the power module 10. The mold compound used for the housing 12 may be a transfer or compression molded epoxy molding compound (EMC) capable of providing mechanical structure, high voltage isolation, coefficient of thermal expansion (CTE) matching, and low humidity absorption.

As illustrated in FIGS. 3 and 8, the thermal pad 14 on the backside of the power module 10 is exposed without coverage of the housing material. During fabrication, an epoxy resin used for the housing 12 may seep in and leave a small amount of flashing on the thermal pad 14. To ensure the mold compound or other encapsulant does not cover the outside surface of the thermal pad 14, hold down pins may be used to apply pressure on the edges or other surfaces of the substrate S to enhance the seal to the mold tooling. These pins retract as the material cures and may leave a vestige 44 in the compound. Ejector pins are used to release the product from the mold tooling and will also leave small vestiges. The number and location of the hold down and ejector pins will vary based on the design embodiment, as more or fewer of these elements may be required as the width of the module varies.

Clearance and creepage are important aspects for a high voltage product. Between conductors at different voltage potentials, clearance is the shortest direct path in air between them. Creepage is the shortest direct path along a surface between them. Meeting safety standards is a challenge and is often at odds with manufacturing (tooling, epoxy flow, etc.) and product size (footprint and power density). For small transfer molded packages, particularly low profile and high voltage SiC based products, reaching a suitable balance between module size and voltage safety is necessary.

In certain embodiments, voltage safety is achieved using various techniques. The signal terminals G1-G6, K1-K6 are grouped together based on having the same or similar voltage potentials. Signal terminals G1-G6, K1-K6 of different potentials, such as high side and low side gate and source-Kelvin signal terminals G1-G6, K1-K6, or between those terminals, are spaced to meet clearance standards. For creepage, notches 46 or ridges may be provided between them to increase the surface distance, as illustrated in FIGS. 7 and 8.

Creepage between the signal terminals G1-G6, K1-K6, the power terminals V+, V−, U, V, W, and/or the thermal pad 14, is addressed in a first fashion by adding elongated ledges 48 and ridges on the surface of the compound or placing elongated trenches 50 between the voltage nodes. Specific features will depend on the size and voltage class of a given embodiment of the design. In the illustrated embodiments, the elongated trenches 50 extend along the entirely of the terminal sides of the housing 12, creepage extending notches 46 are provided between the higher voltage terminals along those sides, and a ledge 48 is provided around the perimeter of the power module 10. Also illustrated are mounting notches 52 on the opposing non-terminal sides of the housing. These mounting notches 52 allow the power module 10 to be securely attached to a PCB or other structure using bolts, screws, or other fasteners.

Creepage distance is the surface distance on an insulator, such as the molded housing 12, between conductors of differing electrical potentials, wherein differing electrical potentials in power applications may be considered values greater than ~30V. For higher voltages, such as those characteristic of SiC (>600V), these creepage distances can be quite large (ranging from ~5 to 15 mm, 20 mm, or greater, depending on material, environment, and application). Product sizes can increase dramatically when creepage distances compound on each other when many voltage potentials are present. For example, if multiple voltage potentials are present, each may need its own sufficient creepage distance from its neighbors. To compensate for this, creepage extenders are used to increase the surface distance but not necessarily the product size. Creepage extension can be facilitated with the notches 46, wherein material is removed from the molded housing 12, or ribs, wherein material is added to the housing.

Along the edge of a dual in-line package, there are multiple nodes at high differences in voltage. The number of creepage extending notches 46 is equivalent to the number of these voltage differences. Or, stated alternatively, the number of creepage extending notches 46 is equal to the number of unique voltage nodes minus one (n−1), as the edge conductors don't necessarily need creepage on their opposite sides. A unique voltage node may be considered one in which nearby metals have more than 30V of difference between them. If the control and/or power terminals are less logically arranged, a three-phase topology with a temperature sensor may have up to seven unique nodes along an edge, with six associated creepage extenders/notches.

The disclosed embodiments group power and signal nodes of similar potential (up to ~30V difference) to minimize the number of creepage extending features. In this case, the control and power terminals are arranged as three voltage 'groups' on each side, so that only two creepage extending notches 46 are used along the opposing sides of the molded housing 12. When taking molding features into consideration, where the aspect ratio of the extenders is considered, this approach allows for at least 70%, 75%, 80%, or more of the available width of the molded housing 12 to be used by the terminals or other features. This results in smaller product footprints and wider power tabs. The percentage of the edge used is contingent upon voltage class and operating conditions, and would most likely range from 60% (very high voltages) to 90% (moderate voltages), with the goal of using as little space as possible for creepage extending notches 46.

In the illustrated embodiments, the transistors Q1-Q6 are placed in a row on the respective device pads 18, 20, 22, 24 based on switch position. The overall layout, length, width, aspect ratio, and number of transistors for each switch position may be parametrically varied to scale up or down to the desired output power for the power module 10. Transistors Q1-Q6 and any other devices may be attached with either (1) metal sintering (silver, copper, or other metal), (2) soldering, (3) conductive adhesive, or (4) other electrically and thermally conductive attachment. A temperature sensor, which is represented by temperature circuit 16, may be included and placed either on an isolated device pad 26 as shown or directly next to one of the transistors Q1-Q6, depending on the sensor technology or nature of the temperature circuit 16. The temperature sensor illustrated is generally attached in a similar manner to the transistors Q1-Q6. Depending on attachment method, the substrate metal used for the device pads 18-26 may be fully or partially plated with silver, nickel, nickel/gold, or similar depending on material compatibility.

Fiducials may be added to aid in automated pick and place of the transistors Q1-Q6 and/or any other included components, as well as for subsequent process steps requiring a determination of relative location. Fiducials may be provided by partial plating, etched features or edges, laser marked symbols, or other visually distinctive feature that can be recognized by a machine vision system.

As illustrated in FIGS. 17 and 18, the lower surface of the substrate S includes the large thermal pad 14, which covers a large majority of the substrate S and is intended to be directly attached to a heat sink, cold plate, or similar heat removal apparatus. Such attachment would be formed with either bolting with thermal interface material, metal sintering (silver, copper, or other metal), soldering, conductive adhesive, welding, or other thermally conductive attachment. Other embodiments of the design could be attached in a similar manner to an interstitial base plate, which could then be bolted or welded to the cold plate.

To facilitate a well distributed power loop, and low inductance entry into the power module 10, power terminals V+ and V− are effectively placed on both ends along one side of the power module 10. Power terminal V− effectively provides two terminals that are joined together by the power rail PRV−, which spans the length between them. The two power terminals V+ are joined to the substrate S through wire bonding, as shown, or extended over to the substrate S and attached through solder, sinter, welding, or similar.

Power terminals U, V, W that provide the AC outputs of the three-phase circuit may be wider than power terminals V−, V+ as they often carry full current continuously. The signal terminals G1-G6, K1-K6 may be nestled within regions of similar potential. The bonding sites have extended edges to act as a mold lock for strain relief. Other features on the signal terminals G1-G6, K1-K6, such as notches, holes, etc. may be provided to achieve the same or similar functionality. As noted, pins for the signal and power terminals may be staggered to provide a slight offset, which provides more flexibility and options for connection to the power module 10.

In general, there are two categories of electrical loops in a power module: the power loop and the signal loop. The power loop is a high voltage, high current path between power terminals V+, V− and through the transistors Q1-Q6 for delivering power to a load via the drain (or collector) and source (or emitter) of the transistors Q1-Q6, wherein the load is connected to terminals U, V, W for a three-phase circuit. The signal loop is a low voltage, low current path through the gates G1-G6 (or bases) and the sources (or emitters) of transistors Q1-Q6. The gate-source (or base-emitter) signal path actuates the transistors Q1-Q6 to effectively turn-on or turn-off the transistors Q1-Q6. The signal loop may also entail the source-Kelvin connections K1-K6 of the transistors Q1-Q6.

Figure 20:
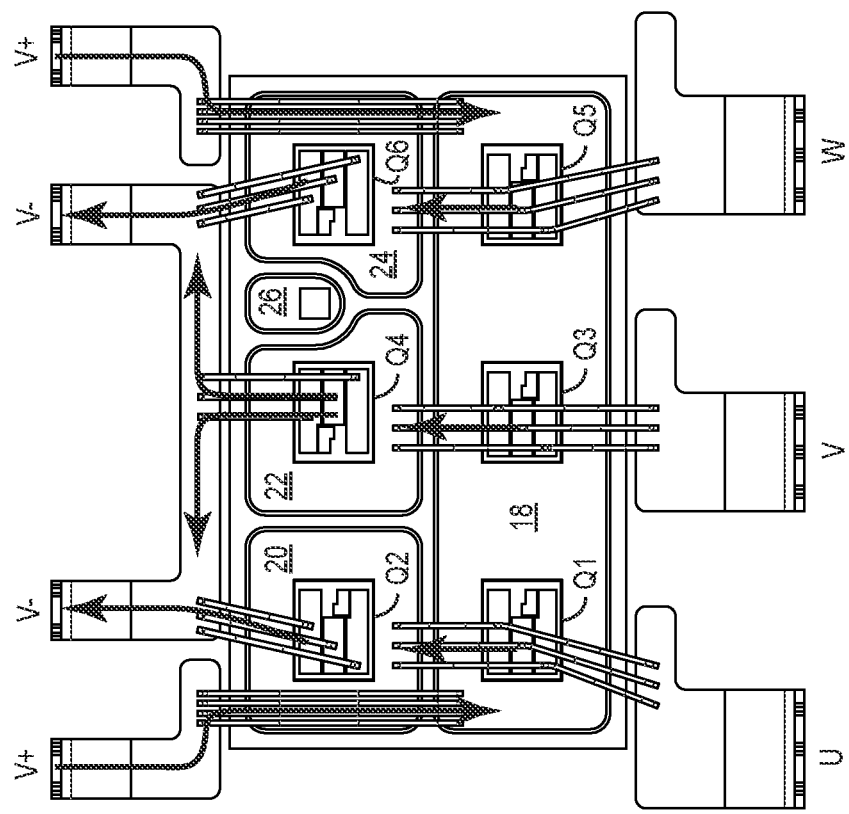
FIG. 20 illustrates an exemplary power loop for the first embodiment of the disclosure.

The power loop effectively runs between power terminals V+, V−. Power terminals V+, V− are typically connected across a DC supply, such as a battery in parallel with a large capacitance. An exemplary power loop for the illustrated power module 10 is shown in FIG. 20. FIG. 20 illustrates an exemplary power commutation loop for the three-phase embodiments described above. The internal and external layout allows the power to enter and leave the power module 10 efficiently and with a good amount of magnetic flux cancellation. Power flows in through (1) power terminal V+, (2) down to device pad 18 of substrate S through power bond wires BW, (3) over to the drains D of high-side transistors Q1, Q3, Q5, (4) up through the high-side transistors Q1, Q3, Q5 to the respective source pads SP, (5) over to the respective device pads 20, 22, 24 of substrate S via bond wires BW, (6) over to the drains D of the respective low-side transistors Q2, Q4, Q6, (7) up through the low-side transistors Q2, Q4, Q6 to the respective source pads SP, and (8) over to Power terminal V− via bond wires BW. For the various outputs, power terminals U, V, W are respectively coupled using daisy chained bond wires BW to the source pads SP of the high-side transistors Q1, Q3, Q5 and the drains D of the low-side transistors Q2, Q4, Q6 via device pads 20, 22, 24. The loops are well balanced for each paralleled device. The low profile of the module, compact module size, flux cancellation, and balanced loops result in extremely low loop inductance and clean, efficient switching.

The signal loops for each transistor position preferably provide a low impedance to minimize voltage stresses on the device gates during switching. While these can be buffered or reduced by adding resistors, this is often at the cost of increased complexity, higher cost, and slower switching speeds. To enhance switching performance, the power loops and signal loops can be substantially, if not completely, independent of each other to enable low switching loss with fast, well controlled dynamics.

In certain embodiments, any drain-source (or collector-emitter) and gate-source (or gate-emitter) loops share the same connection at the source (or emitter) of the various transistors Q1-Q6. If the power path couples into the signal paths, extra dynamics are introduced through either positive or negative feedback. Typically, negative feedback introduces extra losses as the power path coupling fights the control signal. In essence, the power path coupling tries to turn the transistors off when the control signal is trying to turn the transistors on. Positive feedback typically causes instability as the power path coupling amplifies the control signal until the transistors are destroyed. Ultimately, any significant coupling of power and signal paths results in a reduction in switching quality, slower switching speeds, increased losses, and possible destruction.

Accordingly, one way to improve switching quality is to ensure independent power and control loops. The power source connection has a separate path from the signal source (referred to as a source Kelvin) such that one does not overlap or interfere with the other. The closer the separate connections are made to the transistors Q1-Q6, the better the switching performance.

Figure 21:
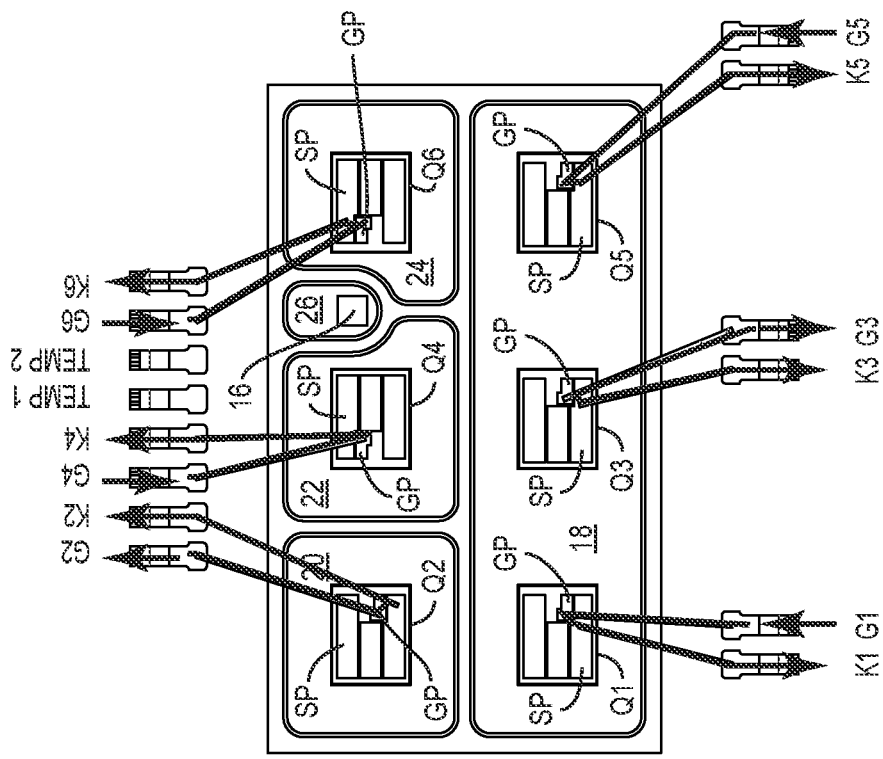
FIG. 21 illustrates an exemplary signal loop according to the first embodiment of the present disclosure.

FIG. 21 illustrates the internal signal loops for the high-side and low-side positions. Here, the signals flow through (1) the signal terminal G1-G6, (2) over bond wires BW to the gate pad GP of transistors Q1-Q6, (4) through the transistors Q1-Q6 from the gate to the source, (3) through a bond wire BW from the source pad (and/or source Kelvin pad) of the transistors Q1-Q6 to the signal terminals K1-K6. In the illustrated embodiment, a true source Kelvin implementation is provided in which the power and signal loops are completely independent.

In some embodiments, transistor devices may be paralleled to increase output current. When paralleling, a further issue arises in transconductance mismatches between the transistor devices. Transconductance is effectively the current gain of the device—the relationship between the output current to the input voltage. During switching, the input voltage rises and results in an associated rise in the output current. If there is a transconductance difference between paralleled transistor devices (which is common in silicon carbide, SiC, power devices), they will each have slightly different turn on characteristics. With different currents running through each device, they will have slightly different voltages across themselves. This voltage mismatch will result in a 'balancing current' that flows between the devices during switching.

This balancing current will prefer the path of least impedance, which could be through the signal loop instead of the power loop. If balancing current flows through the signal loop, it can affect switching quality. Introducing this high, uncontrolled current through the signal loop can also present a reliability concern as the signal loops are not intended to carry high currents. For these paralleled devices, a jumper bond wire BW may be connected between their source pads SP to create a very low impedance pathway for these balancing currents.

Figure 22:
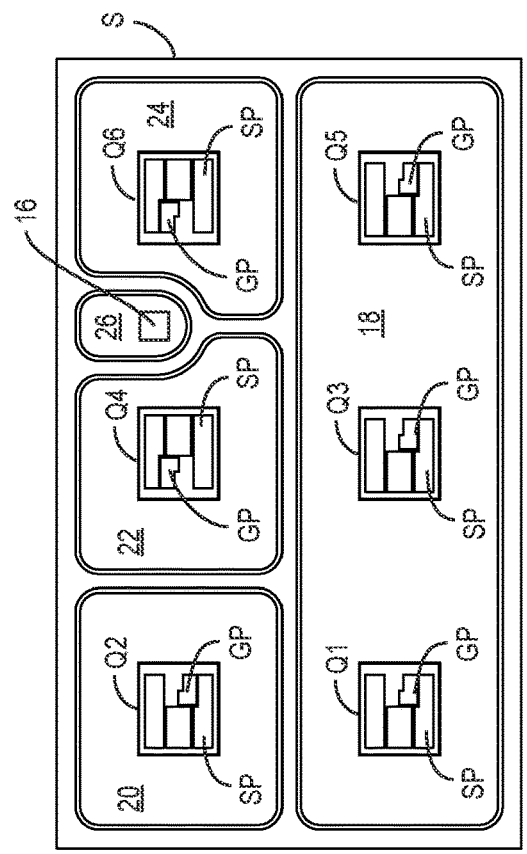
FIG. 22 illustrates an exemplary embodiment of the power module when used with larger power devices.
Figure 23:
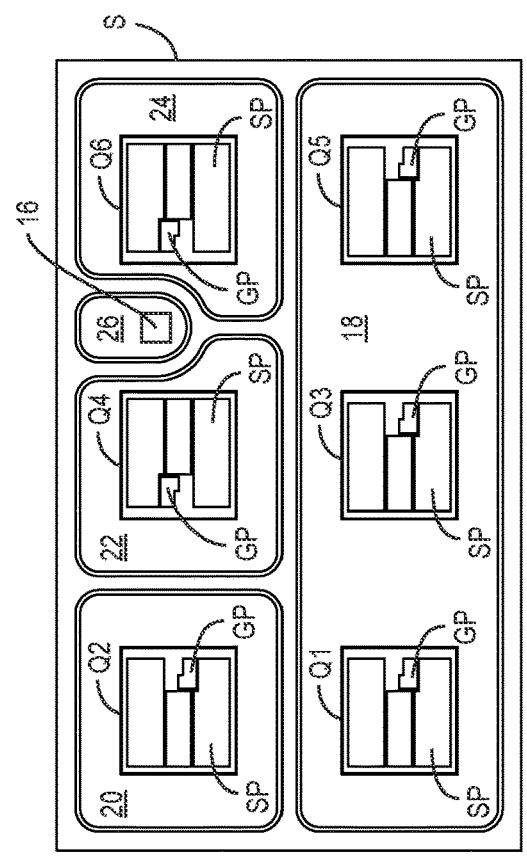
FIG. 23 illustrates an exemplary embodiment of the power module when used with smaller power devices.

Modularity is a beneficial feature of the concepts described herein. Within a given footprint, transistors Q1-Q6 and/or other devices of different sizes can be incorporated, as illustrated in FIGS. 22 and 23. For a given footprint, the transistors Q1-Q6 of FIG. 22 are much larger and higher power than the smaller and lower power transistors Q1-Q6 of FIG. 23. Such flexibility allows the designer to optimize device sizes and operating parameters for a given system and operational conditions. Since the size of the devices often correlates the overall expense of the power module 10, using appropriately sized devices is key to keeping costs down.

In some embodiments the substrate S may be widened to accommodate multiple, paralleled devices such as transistors Q1-Q6, Q1'-Q6', as illustrated in FIGS. 24 and 25. In FIG. 24, a switch position is fully populated with paralleled transistors Q1-Q6, Q1'-Q6', wherein all possible sites are filled. Certain positions could also be de-populated, in which only some of the possible sites are filled, as illustrated in FIG. 25. The dashed boxes represent de-populated areas where additional transistors could reside. This is also a useful technique to adjust device area for a given application, having an additional benefit of not having to develop or manufacture a new custom device. More embodiments and combinations are envisioned with different device rotations, depending on bond pad layouts, different device sizes, and larger or smaller numbers of paralleled devices.

Figure 26:
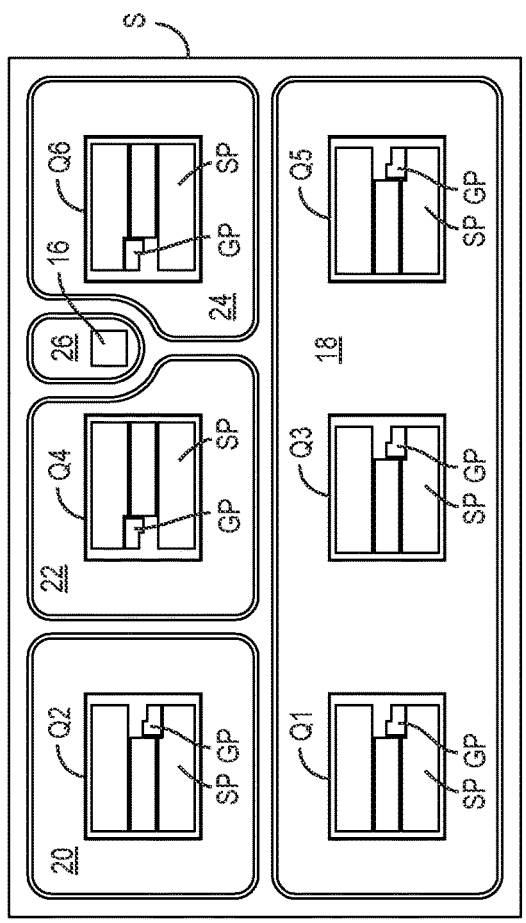
FIG. 26 illustrates an exemplary larger embodiment of the power module.
Figure 27:
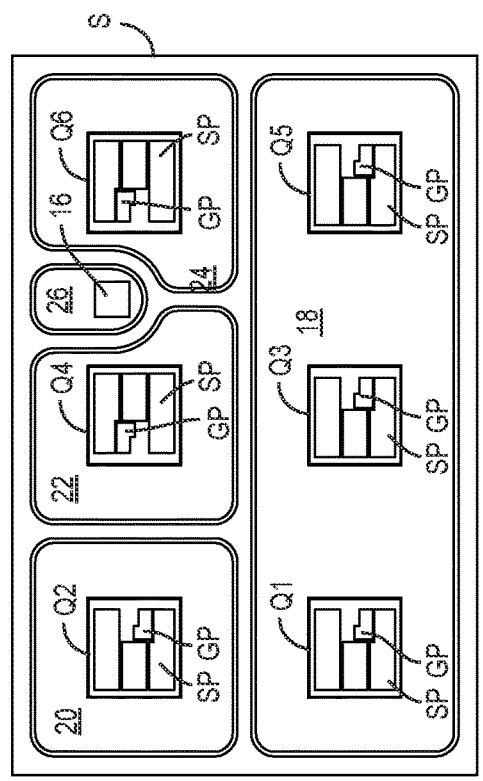
FIG. 27 illustrates an exemplary smaller embodiment of the power module.

In addition to being highly modular, the layout for the power module 10 is readily scalable to be as compact as possible for the required device size and count. Parametric scalability gives the product designer many variables to adjust to streamline thermal performance and product size for desired electrical performance parameters. FIGS. 26 and 27 illustrate the scalable nature of the power module 10. The power module 10 of FIG. 26 employs larger, more powerful transistors Q1-Q6 on a larger substrate S, wherein the power module 10 of FIG. 27 employs smaller, less powerful transistors Q1-Q6 on a smaller substrate S.

Figure 29:
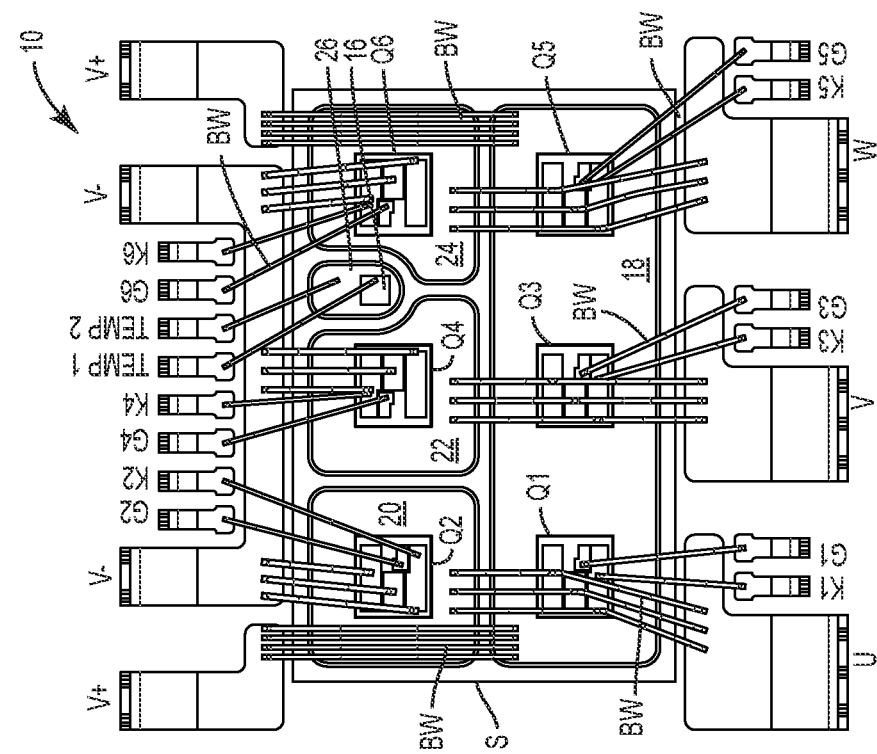
FIGS. 28 and 29 are top plan views of power module having different lengths without the housing.
Figure 28:
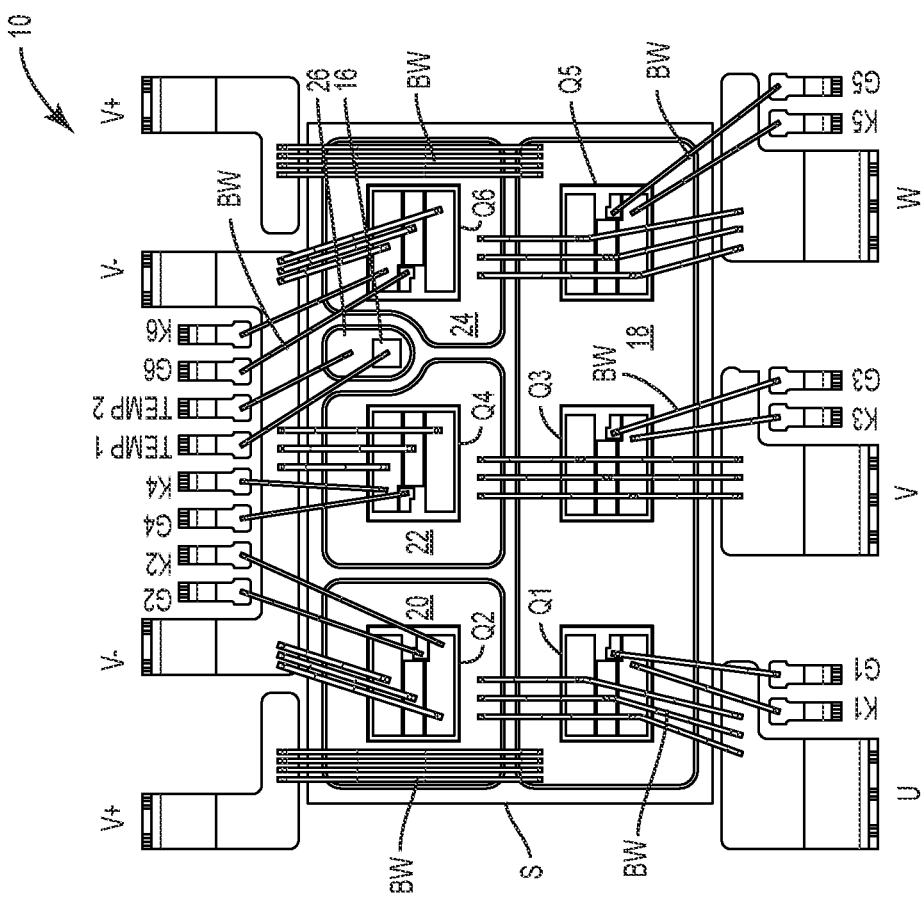

As the power module 10 scales up or down, the internal layout also scales with it. As the current will vary based on total device area, wider electrical paths dynamically scale to properly carry current without excessive resistive losses. Scaling the electrical paths helps ensure the effective current paths to each device are practically equalized. The scaling of internal and external features is displayed in FIGS. 28 and 29, wherein FIG. 28 corresponds to the scaled embodiment of FIG. 26 and FIG. 29 corresponds to the scaled embodiment of FIG. 27. FIGS. 30 and 31 illustrate the power module 14 with the housing 12 for the scaled embodiments of FIGS. 28 and 29, respectively. In some situations, as the size scales, the width of the power terminals and number of power wire bonds may be scaled up or down as needed or desired.

The concepts disclosed herein provide an optimized three-phase package design for the next generation of power modules 10. A modular layout is possible where multiple device areas can be fully or partially populated in the same structure. The scalable layout supports multiple optimized products by simply increasing or decreasing the length and width to achieve the desired power device area and/or size. The layout may be optimized for high currents by grouping the power and signal terminals. The inline edges may be used for the power terminal area instead of relying on voltage isolation.

The architecture provides a logical flow of power with minimal or reduced power loop inductance, which results in clean, efficient switching. The architecture provides a low inductance structure with minimal voltage overshoot to facilitate higher bus voltages and higher voltage operation. The layout also supports paralleling two or more power devices per switch position, while providing nearly identical power loop inductance for each power device.

The signal and power terminals may be arranged and organized by use, with the DC input connections on one side, the AC output connections on the other, and signal contacts grouped by electrical potential. A dual DC input terminal arrangement allows for even power distribution and low inductance connection to external bussing. The internal layout may be configured to minimize bond wire distance, with direct bonding from terminals to device pads.

The concepts herein also provide the option to form electrical connections from power terminals to power substrate through wire bond or by direct soldering. Staggered power and signal terminals may provide voltage isolation clearances between the various signal and power terminals. The in-line power and signal terminals allow regularly spaced pin pitches for headers, PCBs, etc.

The architecture provides a true Kelvin implementation for the signal loops, resulting in clean, efficient switching. An integrated temperature sensor or the like may be placed close to the power devices. The temperature sensor or like circuitry may be placed on an isolated substrate trace (for non-isolated vertical sensors) or placed on the same trace as a device (for lateral isolated sensors). There is an option for an overcurrent/desaturation signal pin to detect overcurrent events.

The architecture may reduce costs through minimizing the number of unique parts used; minimizing the area of the power substrate; maximizing the utilization of the semiconductor area; and volume processing using lead frames, transfer molding, and production automation.

The power module 10 may have molded-in voltage creepage extenders on the top and bottom sides of the package. The power module 10 may also have power terminals configurable for solder attachment, connection to a header, clipped to or soldered to a wire, laser welding, or integrated with press fit contacts for solderless connection. The signal terminals are configurable for solder attachment, connection to a header, clipped to or soldered to a wire, laser welding, or integrated with press fit contacts for solderless connection. The exposed thermal pad on the backside of the power module 10 is configurable for permanent silver sintering, copper sintering, or soldering directly to a cold plate or heat sink. Edge notches of the mold compound for the housing 14 may act as bolt holes, allowing for non-permanent bolting directly to a cold plate or heat sink using a thermal interface material, thermal gap pad, phase change material, or similar.

The concepts provided above, address one, some, or all of the above to provide a unique and novel power module 10. Those skilled in the art will recognize improvements and modifications to the present disclosure. All such improvements and modifications are considered within the scope of the concepts disclosed herein.

What is claimed is:

1. A power module comprising:
 a substrate comprising a backside with a thermal pad and a frontside comprising a plurality of device pads;
 a plurality of power devices mounted on the plurality of device pads and arranged to provide a power circuit having a first input, a second input, and at least one output;
 a first input power terminal providing the first input for the power circuit;
 a second input power terminal providing the second input for the power circuit;
 at least one output power terminal providing the at least one output for the power circuit; and
 a housing that encompasses the substrate, the plurality of power devices, and portions of the first input power terminal, second input power terminal, and at least one output power terminal, wherein the first input power terminal and the second input power terminal extend out of a first side of the housing and the at least one output power terminal extends out of a second side of the housing, the first side opposite the second side;
 further comprising a third input power terminal providing the first input for the power circuit, wherein the second power terminal resides between the first input power terminal and the third input power terminal;
 wherein second input power terminal comprises a first power terminal leg, a second power terminal leg, and a rail that resides within the housing and connects the first power terminal leg with the second power terminal leg.

2. The power module of claim 1, wherein the first input power terminal is adjacent the first power terminal leg of the second input power terminal and the third input power terminal is adjacent the second power terminal leg of the second input power terminal.

3. The power module of claim 2 further comprising a plurality of signal terminals that provide a plurality of control signals for the power circuit, wherein portions of the plurality of signal terminals extend out of the housing.

4. The power module of claim 3 wherein the plurality of signal terminals comprise a first plurality of gate signal terminals that provide gate control signals to gates of a first set of the plurality of power devices and a second plurality of gate signal terminals that provide gate control signals to gates of a second set of the plurality of power devices.

5. The power module of claim 4 wherein the plurality of signal terminals further comprise a first plurality of source-Kelvin signal terminals that provide source-Kelvin control signals to sources of the first set of the plurality of power devices and a second plurality of source-Kelvin signal terminals that provide source-Kelvin control signals to sources of the second set of the plurality of power devices.

6. The power module of claim 5 wherein the first plurality of source-Kelvin signal terminals and the first plurality of gate signal terminals are between the first power terminal leg and the second power terminal leg of the second input power terminal.

7. The power module of claim 6 wherein the at least one output power terminal comprises a first output power terminal providing a first output of the power circuit, a second output power terminal providing a second output of the power circuit, and a third output power terminal providing a third output of the power circuit.

8. The power module of claim 7 wherein a first of the second plurality of source-Kelvin signal terminals is adjacent the first output power terminal, a second of the second plurality of source-Kelvin signal terminals is adjacent the second output power terminal, and a third of the second plurality of source-Kelvin signal terminals is adjacent the third output power terminal.

9. The power module of claim 8 wherein a first of the second plurality of gate signal terminals is adjacent the first of the second plurality of source-Kelvin signal terminals, a second of the second plurality of gate signal terminals is adjacent the second of the second plurality of source-Kelvin signal terminals, and a third of the second plurality of gate signal terminals is adjacent the third of the second plurality of source-Kelvin signal terminals.

10. The power module of claim 1 wherein the at least one output power terminal comprises a first output power terminal providing a first output of the power circuit, a second output power terminal providing a second output of the power circuit, and a third output power terminal providing a third output of the power circuit.

11. The power module of claim 1 wherein the thermal pad is exposed through the housing.

12. The power module of claim 1 wherein the power circuit is a three-phase circuit.

13. The power module of claim 1 wherein notches are recessed into one or more sides of the housing for attaching the power module to another apparatus.

14. The power module of claim 1 wherein each of the first input power terminal, the second input power terminal, and the at least one output power terminal is terminated with at least one linear pin configured for solder attachment to another apparatus.

15. The power module of claim 1 wherein creepage extenders are provided on top and bottom sides of the housing.

16. A power module comprising:
a substrate comprising a backside with a thermal pad and a frontside comprising a plurality of device pads;
a plurality of power devices mounted on the plurality of device pads and arranged to provide a power circuit having a first input, a second input, and at least one output;
a first input power terminal providing the first input for the power circuit;
a second input power terminal providing the second input for the power circuit;
at least one output power terminal providing the at least one output for the power circuit; and
a housing that encompasses the substrate, the plurality of power devices, and portions of the first input power terminal, second input power terminal, and the at least one output power terminal, wherein the first input power terminal and the second input power terminal extend out of a first side of the housing and the at least one output power terminal extends out of a second side of the housing, the first side opposite the second side;
further comprising a plurality of signal terminals that provide a plurality of control signals for the power circuit, wherein portions of the plurality of signal terminals extend out of the housing.

17. The power module of claim 16 wherein the plurality of signal terminals are grouped together and with the first input power terminal, the second input power terminal, and the at least one output power terminal based on electrical potential expected during operation.

18. The power module of claim 16 wherein each of the plurality of signal terminals is terminated with at least one linear pin configured for solder attachment to another apparatus.

19. The power module of claim 18 wherein each of the first input power terminal, the second input power terminal, and the at least one output power terminal are terminated with at least one linear pin configured for solder attachment to another apparatus.

20. The power module of claim 19 wherein each of the plurality of signal terminals, the first input power terminal, the second input power terminal, and the at least one output power terminal are terminated with at least two linear pins configured for solder attachment to another apparatus.

21. The power module of claim 16 wherein pins for a first group of the plurality of signal terminals are aligned in a first plane along the first side of the housing, pins for a second group of the plurality of signal terminals are aligned in a second plane along the second side of the housing, pins for the first and second input power terminals are aligned in a third plane along the first side of the housing, and pins for the at least one output power terminal are aligned in a fourth plane along the second side of the housing.

22. The power module of claim 21 wherein the first and second planes are inside of the third and fourth planes.

23. The power module of claim 22 wherein the plurality of signal terminals are grouped together and with the first input power terminal, the second input power terminal, and the at least one output based on electrical potential expected during operation.

24. The power module of claim 21 wherein the plurality of signal terminals comprise a first plurality of gate signal terminals that provide gate control signals to gates of a first set of the plurality of power devices, and a second plurality of gate signal terminals that provide gate control signals to gates of a second set of the plurality of power devices.

25. The power module of claim 24 wherein the plurality of signal terminals comprise a first plurality of source-Kelvin signal terminals that provide source-Kelvin control signals to sources of the first set of the plurality of power devices, and a second plurality of source-Kelvin signal terminals that provide source-Kelvin control signals to sources of the second set of the plurality of power devices.

26. A power module comprising:
a substrate comprising a backside with a thermal pad and a frontside comprising a plurality of device pads;
a plurality of power devices mounted on the plurality of device pads and arranged to provide a power circuit having a first input, a second input, and at least one output;
a first input power terminal providing the first input for the power circuit;
a second input power terminal providing the second input for the power circuit;
at least one output power terminal providing the at least one output for the power circuit; and
a housing that encompasses the substrate, the plurality of power devices, and portions of the first input power terminal, second input power terminal, and the at least one output power terminal, wherein the first input power terminal and the second input power terminal extend out of a first side of the housing and the at least one output power terminal extends out of a second side of the housing, the first side opposite the second side;
wherein: at least one first notch is provided in the first side of the housing between the first input power terminal and the second input power terminal; the at least one output power terminal comprises a plurality of output terminals; and at least one second notch is provided between each adjacent pair of the plurality of output terminals;
wherein at least 75 percent of a width of each of the first side and the second side of the housing is allocated for terminals comprising the first input power terminal, the second input power terminal, the at least one output power terminal, and signal terminals.

27. The power module of claim 26 wherein the terminals are grouped by potential into terminal groups, wherein one of the at least one first notch and the at least one second notch is provided between adjacent pairs of the terminal groups, and each terminal within each terminal group has a potential within 30 volts during operation.

28. The power module of claim 26 wherein an effective creepage distance provided by each of the at least one first notch and the at least one second notch is in a range of 5 millimeters to 15 millimeters.

29. A power module comprising:
a substrate comprising a backside with a thermal pad and a frontside comprising a plurality of device pads;
a plurality of power devices mounted on the plurality of device pads and arranged to provide a power circuit having a first input, a second input, and at least one output;
a first input power terminal providing the first input for the power circuit;
a second input power terminal providing the second input for the power circuit;
at least one output power terminal providing the at least one output for the power circuit; and
a housing that encompasses the substrate, the plurality of power devices, and portions of the first input power terminal, second input power terminal, and the at least one output power terminal, wherein the first input power terminal and the second input power terminal extend out of a first side of the housing and the at least one output power terminal extends out of a second side of the housing, the first side opposite the second side;
wherein a temperature circuit is provided on the substrate.

* * * * *